US008237693B2

(12) United States Patent
Nishimura et al.

(10) Patent No.: US 8,237,693 B2
(45) Date of Patent: Aug. 7, 2012

(54) OPERATIONAL AMPLIFIER, DRIVE CIRCUIT, AND METHOD FOR DRIVING LIQUID CRYSTAL DISPLAY DEVICE

(75) Inventors: Kouichi Nishimura, Kanagawa (JP); Atsushi Shimatani, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 835 days.

(21) Appl. No.: 12/314,589

(22) Filed: Dec. 12, 2008

(65) Prior Publication Data

US 2009/0179890 A1 Jul. 16, 2009

(30) Foreign Application Priority Data

Jan. 10, 2008 (JP) .................................... 2008-3436

(51) Int. Cl.
*G09G 5/00* (2006.01)
*H03F 3/45* (2006.01)

(52) U.S. Cl. ........... 345/204; 345/89; 330/252; 330/253

(58) Field of Classification Search .................. 345/204, 345/87–100; 330/252–257
See application file for complete search history.

(56) References Cited

U.S. PATENT DOCUMENTS 4,570,128 A 2/1986 Monticelli
7,414,441 B2 * 8/2008 Lee et al. ...................... 327/108
7,495,512 B2 * 2/2009 Tsuchi .......................... 330/260
2001/0004255 A1 * 6/2001 Nishimura .................... 345/204
2005/0068105 A1 * 3/2005 Shimatani ..................... 330/255
2005/0270264 A1 * 12/2005 Kokubun et al. ................ 345/98
2006/0091955 A1 * 5/2006 Choi ............................ 330/260
2006/0226877 A1 * 10/2006 Nishimura et al. ............. 327/52
2007/0159249 A1 * 7/2007 Nishimura et al. ........... 330/253
2008/0036538 A1 * 2/2008 Lee .............................. 330/255

FOREIGN PATENT DOCUMENTS

CN 1845452 A 10/2006
CN 1992512 A 7/2007
JP 61-35004 2/1986
JP 11-249623 9/1999

OTHER PUBLICATIONS

Notification of First Office Action dated Feb. 28, 2012 (with an English translation).

* cited by examiner

*Primary Examiner* — Amare Mengistu
*Assistant Examiner* — Hong Zhou
(74) *Attorney, Agent, or Firm* — McGinn IP Law Group, PLLC

(57) ABSTRACT

The present invention enables rising and falling slew rates to be symmetrized and secures a drive current at the time of 2H inversion driving. An operational amplifier in accordance with one aspect of the present invention includes: a first output transistor and a second output transistor connected in series between a first power supply and a second power supply; an output terminal connected to a node between the first output transistor and the second output transistor; a phase-compensating element provided either between the gate of the first output transistor and the output terminal or between the gate of the second output transistor and the output terminal; and a floating current source connected between the gate of the first output transistor and the gate of the second output transistor.

14 Claims, 8 Drawing Sheets

OPERATIONAL AMPLIFIER, DRIVE CIRCUIT, AND METHOD FOR DRIVING LIQUID CRYSTAL DISPLAY DEVICE

BACKGROUND OF THE INVENTION

1. Field of the Invention

The present invention relates to an operational amplifier, a drive circuit using the operational amplifier, and a method for driving a liquid crystal display device using the operational amplifier. More particularly, the present invention relates to an operational amplifier used to drive a capacitive load, such as a liquid crystal panel, a drive circuit using the operational amplifier, and a method for driving a liquid crystal display device using the operational amplifier.

2. Description of the Related Art

Conventionally, an operational amplifier has been configured using bipolar transistors in most cases. For reasons of a growing need for the coexistence of bipolar transistors with a MOS circuit and for low-power operation, however, the operational amplifier is configured using MOS transistors more often than ever these days. When configuring the operational amplifier with MOS transistors, there is the case that a circuit configuration different from that of an operational amplifier configured with bipolar transistors is adopted by taking advantage of analog characteristics inherent in a MOS transistor. Examples of such an operational amplifier include an amplifier using an electronic switch function.

One of the application areas of an operational amplifier configured with MOS transistors is a TFT LCD (Thin Film Transistor Liquid Crystal Display) driver LSI (see, for example, Japanese Patent Laid-Open No. 61-35004). This LCD driver LSI includes a plurality of operational amplifiers having a voltage follower configuration as output buffer amplifiers and gray-scale power supplies for gamma-correction. The LCD driver LSI is required to have only a small difference in offset voltage among this plurality of operational amplifiers. This is because even a voltage difference of 10 mV is recognized as a distinct gray-scale level for human eyes for reasons of the characteristics of a TFT LCD. Hence, there is a demand in this area for a MOS operational amplifier having an extremely small offset voltage.

FIGS. 7 and 8 are circuit diagrams showing configuration examples of an operational amplifier used to drive a conventional liquid crystal display device described in Japanese Patent Laid-Open No. 11-249623. Referring to FIG. 7, the conventional operational amplifier includes PMOS transistors MP1 and MP2, a constant current source I1, NMOS transistors MN1, MN2 and MN3, a constant current source I2, a phase-compensating capacitor C, and switches S1, S2, S3, S4, S5, S6, S7 and S8.

The two PMOS transistors MP1 and MP2 constitute a differential pair. The constant current source I1 biases this differential pair and is inserted between a point to which the sources of the PMOS transistor MP1 and MP2 are connected in common and a positive power supply VDD. The NMOS transistors MN1 and MN2 are configured as a current mirror and serve also as an active load and a differential-to-single-ended conversion function. The NMOS transistor MN3 constitutes a second-stage amplifier circuit. The constant current source I2 is inserted between the drain of the NMOS transistor MN3 and the positive power supply VDD. This constant current source I2 serves as the active load of the NMOS transistor MN3. The phase-compensating capacitor C is inserted between the gate and the drain of the NMOS transistor MN3.

Here, the technical terms to be referred to hereinafter will be described. A "make-type switch" refers to a type of switch which closes when a control signal is input. In contrast, a "break-type switch" refers to a type of switch which opens when a control signal is input. In addition, a "transfer-type switch" refers to a type of switch which has a common terminal and two output terminals (make-side and break-side terminals) in which the common terminal and the make-side terminal go into a connected state when a control signal is input, and the common terminal and the break-side terminal go into a connected state when a control signal is not input.

A break-type switch S1 is inserted between the gate and the drain of the NMOS transistor MN1. In addition, a make-type switch S2 is inserted between the gate and the drain of the NMOS transistor MN2. A make-type switch S3 is connected between the drain of the NMOS transistor MN1 and the gate of the NMOS transistor MN3. A break-type switch S4 is connected between the drain of the NMOS transistor MN2 and the gate of the NMOS transistor MN3. A make-type switch S5 is connected between the gate of the PMOS transistor MP2 and an output terminal Vout. A break-type switch S6 is connected between the gate of the PMOS transistor MP1 and the output terminal Vout. A make-type switch S7 is connected between the gate of the PMOS transistor MP1 and an input terminal Vin. A break-type switch S8 is connected between the gate of the PMOS transistor MP2 and the input terminal Vin.

The drain of one PMOS transistor MP1 constituting the differential pair is connected to the drain of the NMOS transistor MN1. In addition, the drain of the other PMOS transistor MP2 constituting the differential pair is connected to the drain of the NMOS transistor MN2. The switches S1 to S8 are all controlled in conjunction with one another. The amplifier shown in FIG. 7 is used to output a supply voltage from VSS to VCOM (VDD/2) (so-called negative output) and has the characteristic that the switches S1 to S8 are operated for each frame or each single horizontal scan period. Note that FIGS. 7A and 7B show two states (states A and B) which these switches S1 to S8 take when operated.

Referring to FIG. 7, the conventional operational amplifier includes NMOS transistors MN1 and MN2, a constant current source I1, PMOS transistors MP1, MP2 and MP3, a constant current source I2, a phase-compensating capacitor C, and switches S1, S2, S3, S4, S5, S6, S7 and S8.

The two NMOS transistors MN1 and MN2 constitute a differential pair. The constant current source I1 biases this differential pair and is inserted between a point to which the sources of the NMOS transistor MN1 and MN2 are connected in common and a negative power supply VSS. The PMOS transistors MP1 and MP2 are configured as a current mirror and serve also as an active load and a differential-to-single-ended conversion function. The PMOS transistor MP3 constitutes a second-stage amplifier circuit. The constant current source I2 is inserted between the drain of the PMOS transistor MP3 and the negative power supply VSS. This constant current source I2 serves as the active load of the PMOS transistor MP3. The phase-compensating capacitor C is inserted between the gate and the drain of the PMOS transistor MP3.

A break-type switch S1 is inserted between the gate and the drain of the PMOS transistor MP1. In addition, a make-type switch S2 is inserted between the gate and the drain of the PMOS transistor MP2. A make-type switch S3 is connected between the drain of the PMOS transistor MP1 and the gate of the PMOS transistor MP3. A break-type switch S4 is connected between the drain of the PMOS transistor MP2 and the gate of the PMOS transistor MP3. A break-type switch S5 is connected between the gate of the NMOS transistor MN2 and an output terminal Vout. A break-type switch S6 is connected between the gate of the NMOS transistor MN1 and the output terminal Vout. A break-type switch S7 is connected between the gate of the NMOS transistor MN1 and an input terminal Vin. A make-type switch S8 is connected between the gate of the NMOS transistor MN2 and the input terminal Vin.

The drain of one NMOS transistor MN1 constituting the differential pair is connected to the drain of the PMOS transistor MP1. In addition, the drain of the other NMOS transistor MN2 constituting the differential pair is connected to the drain of the PMOS transistor MP2. The switches S1 to S8 are all controlled in conjunction with one another. The amplifier shown in FIG. 8 is used to output a supply voltage from VCOM (VDD/2) to VDD (so-called positive output) and has the characteristic that the switches S1 to S8 are operated for each frame or each single horizontal scan period. Note that FIGS. 8A and 8B show two states (states A and B) which these switches S1 to S8 take when operated.

Next, FIG. 9 shows examples of application in which the amplifiers shown in FIGS. 7 and 8 are applied to an LCD driver. In the LCD driver shown in FIG. 9, the amplifier shown in FIG. 8 is applied to an AMP1 and the amplifier shown in FIG. 7 is applied to an AMP2.

Transfer-type switches (SW1 and SW2) are respectively provided in the outputs of the AMP1 and AMP2. The switches SW1 and SW2 select between the outputs of the AMP1 and AMP2 for an odd-numbered output terminal (Vout odd) and an even-numbered output terminal (Vout even). At this time, if one state is taken for example, then the output of the AMP1 is output to the odd-numbered output terminal and the output of the AMP2 is output to the even-numbered output terminal. Alternatively, the other state reverses the above-described operation. That is, the output of the AMP1 is output to the even-numbered output terminal and the output of the AMP2 is output to the odd-numbered output terminal.

Positive-side data is input to an input of the AMP1 and negative-side data is input to an input of the AMP2. By connecting the amplifiers in this way and driving the switches SW1 and SW2 in an interlocked manner on a frame-by-frame basis, such an output image as shown in FIG. 10 is obtained. Note that in a driving method known as dot-inversion driving, these switches SW1 and SW2 are operated for each single horizontal scan period. This method will not be described in detail here, however.

The conventional operational amplifier circuit shown in FIG. 7 is configured with the PMOS transistors MP1 and MP2 constituting a differential pair and the NMOS transistors MN1 and MN2 configured as a current mirror and serving also as the active load and the differential-to-single-ended conversion function of the differential pair. Here, when the switch S1 closes, the drain of the N-channel MOS transistor MN2 serves as the single-ended output thereof. When the switch S2 closes, the drain of the N-channel MOS transistor MN1 serves as the single-ended output thereof. The output terminal changes in this way according to the states of the switches S1 and S2 and, therefore, the switches S3 and S4 are provided for output selection. A signal subjected to single-ended conversion through these switches S3 and S4 is input to the gate of the NMOS transistor MN3 which is an output transistor. At this time, the constant current source I2 functions as the active load of the NMOS transistor MN3. In addition, the drain of the NMOS transistor MN3 serves as the output terminal. The capacitor C provided as a mirror capacitor functions as a phase compensator.

In order to use the operational amplifier circuit as a buffer amplifier, the circuit is configured to form a so-called voltage follower connection in which the inverting input terminal and the output terminal are connected to each other. The voltage follower connection is a connection method in which the inverting input terminal and the output terminal of an amplifier are connected to each other and an input signal is applied to the non-inverting input terminal so that the signal is output from the output terminal of the amplifier. This method causes the same voltage as the input voltage to be output. When the switches S1 to S4 are operated, the inverting input terminal changes to the gate of the PMOS transistor MP1 or to the gate of the PMOS transistor MP2. Accordingly, the switches S5 and S6 are provided to select the inverting input terminal between these gates. That is, when the switches S1 and S4 close, the inverting input terminal changes to the gate terminal of the PMOS transistor MP1. Accordingly, by closing the switch S6 at this time, the inverting input terminal and the output terminal are connected in common to each other to form a voltage follower connection. Since the non-inverting input terminal changes to the gate terminal of the PMOS transistor MP2, the switch S8 is closed to connect the gate terminal to the input terminal Vin.

Conversely, when the switches S2 and S3 close, the inverting input terminal changes to the gate terminal of the PMOS transistor MP2. Consequently, the inverting input terminal and the output terminal are connected in common to each other by closing the switch S5 at this time, thereby forming a voltage follower connection. Since the non-inverting input terminal changes to the gate terminal of the PMOS transistor MP1, the switch S7 is closed to connect the gate terminal to the input terminal Vin. This means that operating the switches S1 to S8 gives rise to two states (states A and B). These two states are switched between on a frame-by-frame basis (or for each single horizontal scan period).

Now, assume that an offset voltage +Vos has been produced in the conventional operational amplifier of FIG. 7. Then, the offset voltage changes to −Vos when the switches S1 to S8 are operated. Consequently, operating these switches S1 to S8 for each two frames (or for each single horizontal scan period) causes the offset voltage to disperse spatially. Thus, on average, the offset voltage equals zero. Accordingly, the offset voltage is recognized as the averaged voltage, i.e., as being zero, for human eyes. In other words, this method is intended to play tricks on human eyes.

Since the amplifier of FIG. 7 is a differential stage configured with PMOS transistors, it is not possible to apply a voltage as high as or higher than VDD−1 V to the input on the positive power supply I1 side. This is because the bias current source I1 no longer operates due to the gate-source voltages of the PMOS transistors MP1 and MP2 in the differential stage. However, for voltages near the VSS, it is possible to input a voltage of almost up to the VSS, though this depends on the gate-source voltages of the NMOS transistors MN1 and MN2 serving as an active load.

The conventional operational amplifier circuit of FIG. 8 is configured with the NMOS transistors MN1 and MN2 constituting a differential pair and the PMOS transistors MP1 and MP2 configured as a current mirror and serving as the active load and the differential-to-single-ended conversion function of the differential pair. Here, when the switch S1 closes, the drain of the PMOS transistor MP2 serves as the single-end output thereof and, when the switch S2 closes, the drain of the PMOS transistor MP1 serves as the single-ended output thereof. The output terminal changes in this way according to the states of the switches S1 and S2 and, therefore, the switches S3 and S4 are provided for output selection. A signal subjected to single-ended conversion through these switches S3 and S4 is input to the gate of the PMOS transistor MP3 which is an output transistor. At this time, the constant current source I2 functions as the active load of the PMOS transistor MP3. In addition, the drain of the PMOS transistor MP3 serves as the output terminal. The capacitor C provided as a mirror capacitor functions as a phase compensator. In order to use the operational amplifier circuit as a buffer amplifier, the circuit is configured to form a so-called voltage follower connection in which the inverting input terminal and the output terminal are connected to each other.

When the switches S1 to S4 are operated at this time, the inverting input terminal changes to the gate of the NMOS transistor MN1 or to the gate of the NMOS transistor MN2. Accordingly, the switches S5 and S6 are provided to select the inverting input terminal between these gates. That is, when the switches S1 and S4 close, the inverting input terminal changes to the gate terminal of the NMOS transistor MN1. Accordingly, the switch S6 is closed at this time to connect the inverting input terminal and the output terminal to each other to form a voltage follower connection. Since the non-inverting input terminal changes to the gate terminal of the NMOS transistor MN2, the switch S8 is closed so that the gate terminal of the NMOS transistor MN2 is connected to the input terminal Vin.

Conversely, when the switches S2 and S3 close, the inverting input terminal changes to the gate terminal of the NMOS transistor MN2. Consequently, the inverting input terminal and the output terminal are connected in common to each other by closing the switch S5 at this time, thereby forming a voltage follower connection. Since the non-inverting input terminal changes to the gate terminal of the NMOS transistor MN1, the switch S7 is closed so that the gate terminal of the NMOS transistor MN1 is connected to the input terminal Vin. This means that operating the switches S1 to S8 gives rise to two states (states A and B). These two states are switched between on a frame-by-frame basis (or for each single horizontal scan period). Now, assume that an offset voltage +Vos has been produced in the conventional operational amplifier of FIG. 8. Then, the offset voltage changes to −Vos when the switches S1 to S8 are operated. Consequently, operating these switches S1 to S8 on a frame-by-frame basis (or for each single horizontal scan period) causes the offset voltage to disperse spatially, as in the case of FIG. 7. Thus, on average, the offset voltage equals zero. Accordingly, the offset voltage is recognized as the averaged voltage, i.e., as being zero, for human eyes.

Since the amplifier of FIG. 8 is a differential stage configured with NMOS transistors, it is not possible to apply a voltage as low as or lower than VSS+1 V to the input on the negative power supply side. This is because the bias current source I1 no longer operates due to the gate-source voltages of the NMOS transistors MN1 and MN2 in the differential stage. However, for voltages near the VDD, it is possible to input a voltage of almost up to the VDD, though this depends on the gate-source voltages of the PMOS transistors MP1 and MP2 serving as an active load.

FIG. 9 is a circuit diagram showing a configuration of an LCD driver which uses the amplifiers of FIGS. 7 and 8. Referring to FIG. 9, the amplifier for positive-side use only shown in FIG. 8 is used for a positive-side (VDD/2 to VDD) amplifier AMP1 and the amplifier for negative-side use only shown in FIG. 7 is used for a negative-side (VSS to VDD/2) amplifier AMP2. The respective outputs of these amplifiers are provided with selector switches so that a signal can be output either to an odd-numbered output (Vout_odd) or to an even-numbered output (Vout_even). Consequently, it is possible to output either a positive-side voltage or a negative-side voltage to the output in question no matter whether the output is an odd-numbered output or an even-numbered output. This is a conventional, so-called two-amplifier system.

Now, an explanation will be made of a method for driving an LCD driver called dot-inversion driving. Dot-inversion driving is a driving method in which a positive (+) polarity signal and a negative (−) polarity signal are alternately output on a dot-by-dot basis on the basis of a VCOM. In addition, the polarity of a signal to be output to each dot needs to be inverted on a frame-by-frame basis. Accordingly, the driving method needs to be implemented with each four frames grouped into one set, as shown in FIG. 10, in order to perform offset canceling using a frame signal. This means that if a positive (+) polarity signal is output by the AMP1 in a first frame, then a negative (−) polarity signal is output by the AMP2 in a second frame. At this time, an offset-canceling signal is not changed in the first and second frames. Then, in a third frame, the offset-canceling signal is inverted to output a positive (+) polarity signal by the AMP1. In a fourth frame, a negative (−) polarity signal is output by the AMP2 with the offset-canceling signal also inverted.

Note here that it is a sum of the absolute values of positive (+) and negative (−) side amplitudes that affects image quality. In FIG. 10, if a difference between an amplitude denoted as "amplitude A" and an amplitude denoted as "amplitude B" remains the same, then the two amplitudes are recognized as being of the same gray scale. Accordingly, if the absolute value of an offset voltage based on an offset-canceling control signal is the same on each of the positive and negative sides before and after control, then the amplitude A and the amplitude B result in the same value. Offset canceling can be realized in this way. The difference between the amplitudes A and B is referred to as an "amplitude difference deviation" and is the most important parameter in an LCD driver. This amplitude difference deviation, if too large, may cause such a problem that vertical streaks appear on an LCD display.

However, if the LCD driver is configured as shown in FIG. 9 by exclusively using the amplifier shown in FIG. 7 on the negative side and the amplifier shown in FIG. 8 on the positive side, the LCD driver cannot meet the requirements for a driving method called 2H inversion driving. This 2H inversion driving is a method for driving the positive-side or negative-side voltage for two horizontal scan periods in a row. FIG. 11 shows an output signal of the 2H inversion driving method. The current-sourcing capacity of the amplifier shown in FIG. 7 is only as large as that of the current source I2 at the maximum and the current-sinking capacity of the amplifier shown in FIG. 8 is only as large as that of the current source I2 at the maximum. Thus, the amplifiers have no larger drive current capacities than those described above. Accordingly, in the 1Hth rising waveform shown in FIG. 11, for example, the operation of the amplifier of FIG. 8 is current-sourcing operation and, therefore, there is no problem. However, if the voltage of the 2Hth waveform is lower than that of the 1Hth waveform, the amplifier is current-sinking operation, thus falling short of drive current. Note that it is possible to allow the amplifier shown in FIG. 7 to have a significantly large current-sinking capacity, though this depends on the size of the NMOS transistor MN3. Likewise, it is possible to allow the amplifier shown in FIG. 8 to have a significantly large current-sourcing capacity, though this depends on the size of the PMOS transistor MP3.

Furthermore, the amplifiers shown in FIGS. 7 and 8, when used for the gamma amplifiers (which refer to amplifiers for adjusting the gamma characteristic of the LCD panel by applying voltages to the respective taps of a gamma resistor, though not shown in the figure) of an LCD panel, only have the capability of driving one polarity and is, therefore, not adoptable.

SUMMARY OF THE INVENTION

An operational amplifier in accordance with one aspect of the present invention includes: a first output transistor and a second output transistor connected in series between a first power supply and a second power supply; an output terminal connected to a node between the first output transistor and the second output transistor; a phase-compensating element provided either between the gate of the first output transistor and the output terminal or between the gate of the second output transistor and the output terminal; and a floating current source connected between the gate of the first output transistor and the gate of the second output transistor. By configuring the operational amplifier as described above, it is possible to symmetrize rising and falling slew rates using a simple circuit configuration, thereby securing a drive current at the time of 2H inversion driving.

According to the present invention, it is possible to provide an operational amplifier, a drive circuit, and a driving method of a liquid crystal display device whereby it is possible to symmetrize rising and falling slew rates using a simple circuit configuration, thereby securing a drive current at the time of 2H inversion driving.

DETAILED DESCRIPTION OF THE PREFERRED EMBODIMENTS

Figure 1:
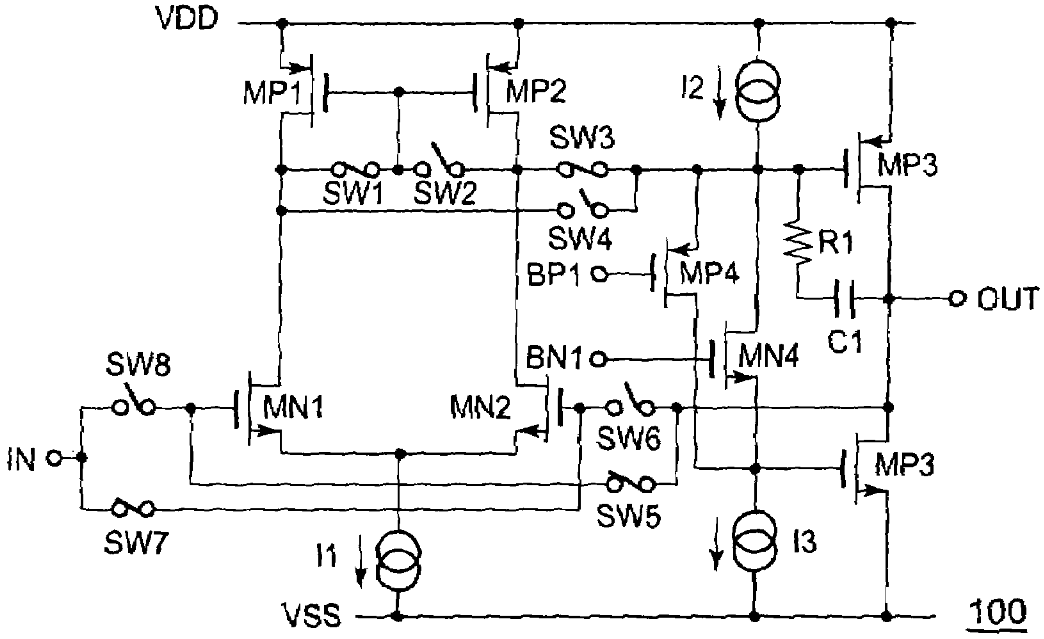
FIG. 1 is a circuit diagram showing a configuration of an operational amplifier in accordance with an embodiment.
Figure 2:
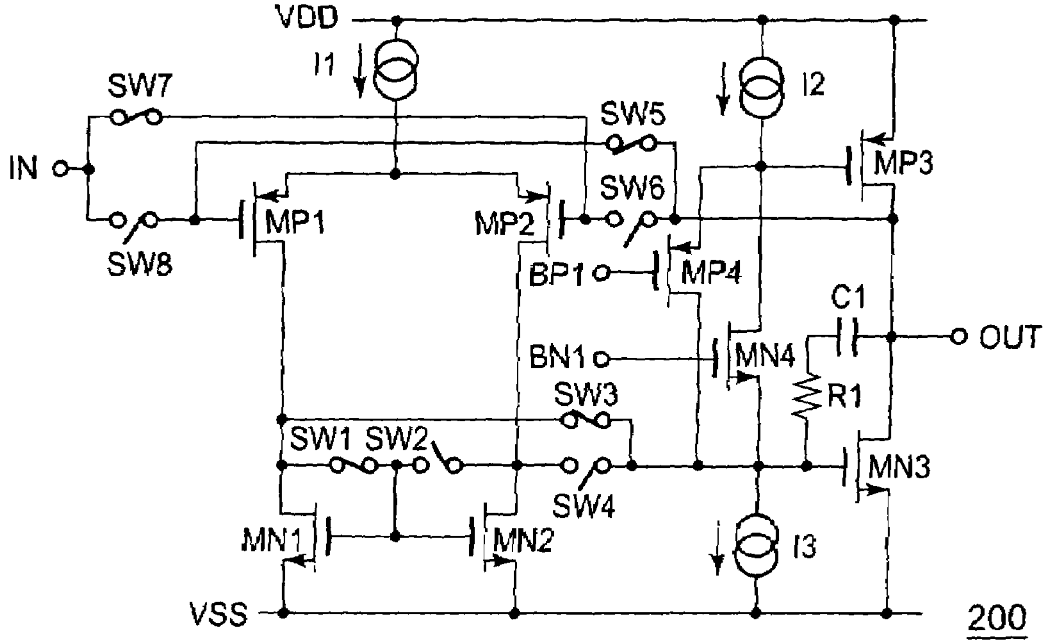
FIG. 2 is another circuit diagram showing a configuration of an operational amplifier in accordance with an embodiment.

Now, a description will be made of an operational amplifier in accordance with Embodiment 1 of the present invention by referring to FIGS. 1 and 2. FIGS. 1 and 2 are circuit diagrams showing configurations of operational amplifiers in accordance with the present embodiment. The operational amplifier in accordance with the present invention is suited, for example, for an output buffer amplifier for an LCD (liquid crystal display) driver used to drive a capacitive load, such as a liquid crystal panel, and for a gray-scale power supply circuit which determines gamma correction. The operational amplifier in accordance with the present invention includes an offset-canceling circuit. Consequently, the operational amplifier can reduce the apparent effect of an offset voltage by spatially dispersing the offset voltage.

An operational amplifier 100 shown in FIG. 1 is designed to cover an input range of VDD/2 to VDD and is an operational amplifier equipped with a so-called positive side-only offset-canceling circuit. In contrast, an operational amplifier 200 shown in FIG. 2 is designed to cover an input range of VSS to VDD/2 and is an operational amplifier equipped with a so-called negative side-only offset-canceling circuit.

As shown in FIG. 1, the operational amplifier 100 equipped with a positive side-only offset-canceling circuit in accordance with the present invention includes NMOS transistors MN1, MN2 and MN4, PMOS transistors MP1, MP2 and MP4, constant current sources I1, I2 and I3, a positive power supply VDD, a negative power supply VSS, constant voltage sources BP1 and BN1, a PMOS output transistor MP3, an NMOS output transistor MN3, switches SW1, SW2, SW3, SW4, SW5, SW6, SW7 and SW8, a resistor R, and a capacitor C.

The two NMOS transistors MN1 and MN2 constitute a differential pair. The sources of the NMOS transistors MN1 and MN2 are connected in common to each other. The constant current source I1 is connected between this common connection point and the negative power supply VSS. The constant current source I1 biases the differential pair constituted by the two NMOS transistors MN1 and MN2.

The PMOS transistors MP1 and MP2 are configured as a current mirror. The PMOS transistors MP1 and MP2 form an active load of the differential pair constituted by the NMOS transistors MN1 and MN2 and serve also as a differential-to-single-ended conversion function. The sources of the PMOS transistors MP1 and MP2 are connected in common to each other. This common connection point is connected to the positive power supply VDD. In addition, the respective gates of the PMOS transistors MP1 and MP2 are connected in common to each other. The break-type switch SW1 is inserted between the gate and the drain of the PMOS transistor MP1. The make-type switch SW2 is inserted between the gate and the drain of the PMOS transistor MP2.

The PMOS output transistor MP3 and the NMOS output transistor MN3 are provided on the output sides of the NMOS transistors MN1 and MN2 and the PMOS transistors MP1 and MP2. The source of the PMOS output transistor MP3 is connected to the positive power supply VDD and the drain thereof is connected to an output terminal OUT. The source of the NMOS output transistor MN3 is connected to the negative power supply VSS and the drain thereof is connected to the output terminal OUT.

That is, one ends of the main current paths of the PMOS output transistor MP3 and the NMOS output transistor MN3 are connected in common to each other. In addition, the common connection point of the PMOS output transistor MP3 and the NMOS output transistor MN3 is connected to the output terminal Vout. That is, the PMOS output transistor MP3 and the NMOS output transistor MN3 are connected in series between the positive power supply VDD and a grounding terminal GND. In addition, the output terminal Vout is connected to a node between the PMOS output transistor MP3 and the NMOS output transistor MN3.

The break-type switch SW3 and the make-type switch SW4 are inserted between the respective drains of the two PMOS transistors MP1 and MP2 constituting a differential pair and the gate of the PMOS output transistor MP3. The constant current source I2 is connected between the positive power supply VDD and the gate of the PMOS output transistor MP3. In addition, the constant current source I3 is connected between the negative power supply VSS and the gate of the NMOS output transistor MN3.

The PMOS transistor MP4 and the NMOS transistor MN4 functioning as floating current sources are respectively provided between the NMOS transistors MN1 and MN2 and the PMOS output transistor MP3 and between the PMOS transistors MP1 and MP2 and the NMOS output transistor MN3. The source of the PMOS transistor MP4 is connected to the gate of the PMOS output transistor MP3 and the drain thereof is connected to the gate of the NMOS output transistor MN3. In addition, the gate of the PMOS transistor MP4 is biased by a constant voltage source BP1. The source of the NMOS transistor MN4 is connected to the gate of the NMOS output transistor MN3 and the drain thereof is connected to the gate of the PMOS output transistor MP3. The gate of the NMOS transistor MN4 is biased by a constant voltage source BN1. In normal operation, the gate voltage values of the PMOS transistor MP4 and the NMOS transistor MN4 are set by the constant voltage sources BP1 and BN1. Consequently, the PMOS transistor MP4 and the NMOS transistor MN4 function as floating current sources based on the gate voltage values thus set.

The break-type switch SW5 is inserted between the output terminal OUT and the gate of the NMOS transistor MN1. The make-type switch SW6 is connected between the output terminal OUT and the gate of the NMOS transistor MN2. The break-type switch SW7 is connected between an input terminal IN and the gate of the NMOS transistor MN2. The make-type switch SW8 is connected between the input terminal IN and the gate of the NMOS transistor MN1. A phase-compensating element, in which a zero point-introducing resistor R1 and a capacitor C1 are connected in series, is connected between the gate and the drain of the PMOS output transistor MP3 as a phase compensator.

In the present embodiment, one of the outputs of a differential amplifier configured with the differential pair and the active load is connected to the gate of the PMOS output transistor MP3 to which the phase-compensating element is connected. That is, either a connection point between the drains of the NMOS transistor MN1 and the PMOS transistor MP1 or a connection point between the drains of the NMOS transistor MN2 and the PMOS transistor MP2 is connected to the gate of the PMOS output transistor MP3 by the switches SW3 and SW4.

In the operational amplifier 100 in accordance with the present embodiment shown in FIG. 1, the switches SW1 to SW8 are all interlocked to one another and are driven simultaneously. The switches SW5 and SW6 are controlled so that the operational amplifier 100 serves as a negative feedback amplifier. That is, the inverting input terminal and the output terminal OUT of the operational amplifier 100 are connected in common to each other to provide a feedback.

A differential stage constituted by the NMOS transistors MN1 and MN2 operates in response to an input voltage range of approximately VSS+1 V to VDD. The reason for this is that, as described in the conventional example, the bias current source I1 no longer operates due to the gate-source voltage of the MOS transistors MN1 and MN2 in the differential stage. The outputs (respective drains) of this differential stage are respectively connected to the active load constituted by the PMOS transistors MP1 and MP2 and are subjected to differential-to-single-ended conversion. The operational amplifier is configured so that the input and output of this active load can be selected by the switch SW1 and SW2.

The switches SW3 and SW4 select the output terminals of the active load. The switches SW7 and SW8 respectively select an input terminal, i.e., a non-inverting input terminal for the amplifier. The output stage of the operational amplifier 100 in accordance with the present embodiment is constituted by the MOS transistors MP3, MP4, MN3 and MN4, constant current sources I2 and I3, a capacitor C1 and a resistor R1 which are phase-compensating elements, and constant voltage sources BP1 and BN1. The operational amplifier 100 performs a class-AB operation. This means that the gates of the PMOS output transistor MP3 and the NMOS output transistor MN3 are biased so that the operational amplifier 100 performs a class-AB output operation. The PMOS transistor MP4, the NMOS transistor MN4 and the constant current sources I2 and I3 constitute a so-called floating current source. Note that specific circuit configurations of the switches SW1 to SW8 will be described later.

The PMOS transistor MP4 and the NMOS transistor MN4 constituting this floating current source and bias voltages VBP1 and VBN1 determine currents (so-called idle currents) which flow through the PMOS output transistor MP3 and the NMOS output transistor MN3 at no load. Whereas one end of a current source constituted by regular transistors is connected to either a power supply terminal or a GND terminal, both ends of this floating current source are in a floating state and, therefore, can be connected to optional locations.

This connection of the PMOS transistor MP4 and the NMOS transistor MN4 causes a current feedback of "1" to be applied locally. Therefore, a common connection point between the source of the PMOS transistor MP4 and the drain of the NMOS transistor MN4 and a common connection point between the drain of the PMOS transistor MP4 and the source of the NMOS transistor MN4 have a high impedance due to the effect of this feedback. That is, a floating current source is constituted by the PMOS transistor MP4 and the NMOS transistor MN4.

This floating current source and the idle currents of the PMOS transistor MP3 and the NMOS transistor MN3 are designed as described below. First, a voltage ($V_{(BP1)}$) generated by the constant voltage source BP1 is set so as to be equal to the sum of the gate-source voltage of the PMOS transistor MP3 and the gate-source voltage of the PMOS transistor MP4. Assuming that the gate-source voltage of the PMOS transistor MP3 is $V_{GS(MP3)}$ and the gate-source voltage of the PMOS transistor MP4 is $V_{GS(MP4)}$, then the voltage $V_{(BP1)}$ can be represented by equation (1) shown below:

$$V_{(BP1)}=V_{GS(MP3)}+V_{GS(MP4)} \qquad (1)$$

In addition, the gate-source voltage $V_{GS}$ of the PMOS transistor MP3 or the PMOS transistor MP4 is represented by equation (2) shown below:

[Formula 2]

$$V_{GS}=\sqrt{\frac{2I_D}{\beta}}+V_T \qquad (2)$$

Note that in equation (2),

[Formula 3]

$$\beta = \frac{W}{L}\mu C_0$$

holds true, where "W" is a gate width, "L" is a gate length, "μ" is a mobility, "$C_0$" is the unit capacitance of a gate oxide film, "$V_T$" is a threshold voltage, and "$I_D$" is a drain current.

The floating current source is designed so that the drain currents of the PMOS transistor MP3 and the NMOS transistor MN3 are equal to each other. That is, the floating current source is designed so that each half (I2/2) of the current value I2 of the current source I2 flows through the PMOS transistor MP4 and the NMOS transistor MN4. On the other hand, the idle current ($I_{idle}$) is designed as represented by the following equation according to equation (1) shown above, assuming that the drain current of the PMOS transistor MP3 is $I_{idle(MP3)}$.

[Formula 4]

$$V_{(BP1)} = \sqrt{\frac{I_3}{\beta_{(MP4)}}} + \sqrt{\frac{2I_{idle}}{\beta_{(MP3)}}} + 2V_T \quad (3)$$

Note that $\beta_{(MP4)}$ denotes the β of the PMOS transistor MP4 and $\beta_{(MP3)}$ denotes the P of the PMOS transistor MP3. Although any detailed circuit for $V_{(BP1)}$ will not be discussed here, it is possible to calculate the idle current $I_{idle(MP3)}$ by solving equation (3) with respect to $I_{idle(MP3)}$.

The current value of the constant current source I3 needs to be equalized to the current value of the above-described current source I2. If the current values differ, the difference flows through the active load, thus leading to an increase in the offset voltage. The voltage of the constant voltage source ($V_{(BN1)}$) to be connected between the negative power supply VSS and the BP1 terminal can also be designed in completely the same way as described above. In the manner described above, a source of constant stray current is set.

Here, the constant voltage sources BN1 ($V_{(BN1)}$) and BP1 ($V_{(BP1)}$), as a result of being configured using two MOS transistors and a constant current source, becomes resistant to fluctuations due to element-to-element variation. The reason for this is that an expression including $V_{(BP1)}$ in the left-side member of equation (3) described above contains the term $2V_T$ which is the same as the term $2V_T$ contained in the right-side member and, therefore, this term is eliminated from both the left- and right-side members.

Phase compensation is carried out using a publicly-known element in which a capacitor and a resistor are connected in series, with the aim of also performing zero-point compensation for canceling a zero point of phase delay (a so-called "wrong" zero point) that the operational amplifier has. (See, for example, "Analysis and Design of Analog Integrated Circuits" coauthored by Paul R. Gray/Robert G. Meyer and published by John Wiley & Sons, Inc.). However, note here that the insertion position of the phase-compensating element is extremely important and is one of the characteristic features of the present invention.

For the phase compensation of an output stage, phase-compensating elements are generally provided both between the gate and the drain of the PMOS output transistor MP3 and between the gate and the drain of the NMOS output transistor MN3. (This method of phase compensation is shown in, for example, FIG. 2 of "Digital-Compatible High-Performance Operational Amplifier with Rail-to-Rail Input and Output Ranges" pp. 64 of IEEE JOURNAL OF SOLID-STATE CIRCUITS, VOL. 29, NO. 1, January 1994, and FIGS. 1 to 4 of "Compact Low-Voltage Power-Efficient Operational Amplifier Cells for VLSI" of IEEE JOURNAL OF SOLID-STATE CIRCUITS, VOL. 33, NO. 10, October 1998, pp. 1483).

However, if the phase-compensating element is inserted in the same way as shown in these documents in the present invention, the rising and falling slew rates of the amplifier become imbalanced. In the operational amplifier 100 shown in FIG. 1, if the phase-compensating capacitor is inserted not only between the gate and the drain of the PMOS output transistor MP3 but also between the gate and the drain of the NMOS output transistor MN3 in the same way as shown in the above-described documents, the discharge currents of the phase-compensating capacitors are restricted by the constant current source I3. In the design of an output stage, the value of the constant current source I3 is generally set so as to be one or more order of magnitude smaller than the value of the constant current source I1. The discharging current of this phase-compensating capacitor is extremely as small as being on the order of a few hundred nanoamperes and the charging current thereof is on the order of a few microamperes in terms of the bias current I1 of the first stage. Hence, it is understandable that the rising and falling slew rates become imbalanced.

In contrast, in the present invention, a phase-compensating capacitor in which a capacitor C1 and a resistor R1 are connected in series is provided only between the gate and the drain of the PMOS output transistor MP3, as shown in FIG. 1. Consequently, both the charging and discharging currents are determined by the bias current I1 of the first stage. Therefore, the rising and falling slew rates are symmetrized. This is extremely important when applying the operational amplifier in accordance with the present invention to an LCD driver.

Next, an explanation will be made of how an offset voltage changes depending on the states of the respective switches SW1 to SW8 of the operational amplifier 100 shown in FIG. 1. Main causes for an offset voltage being produced in the operational amplifier 100 include the relative VT variation of a differential pair constituted by the NMOS transistors MN1 and MN2 and the relative VT variation of the PMOS transistor pair MP1 and MP2 configured as a current mirror circuit and serving as an active load.

The operational amplifier in accordance with the present embodiment has two switch states defined as state A and state B. For example, in a switch state A, the switches SW1, SW3, SW5 and SW7 are defined as being in an on-state and the switches SW2, SW4, SW6 and SW8 are defined as being in an off-state. Conversely, in a switch state B, the switches SW1, SW3, SW5 and SW7 are defined as being in an off-state and the switches SW2, SW4, SW6 and SW8 are defined as being in an on-state. Assuming that when the operational amplifier is in a switch state A, the offset voltage arising due to these relative VT variations is Vos and the input and output voltages of the operational amplifier at that time are Vin and Vo, respectively, then $$Vo = Vin + Vos.$$

Next, if the switches SW1 to SW8 are operated into a switch state B, then the offset voltage is output in a direction opposite in polarity to a switch state A. Therefore, the following equation holds true:

$$Vo = Vin - Vos$$

It is understood that by operating the switches in this way, the output voltage Vo is output symmetrically with respect to an ideal output voltage value Vin. Consequently, by switching between the two states, i.e., states A and B, with the switches SW1 to SW8, the offset voltage is averaged, so to speak, spatially. As a result, the offset voltage reduces to zero and thus offset canceling has been achieved. In addition, in the operational amplifier 100 in accordance with the present embodiment, the output stage is configured for class-AB amplification. Consequently, the operational amplifier can meet the requirements for so-called 2H inversion driving. This 2H inversion driving is a method for driving the positive-side or negative side voltage for two horizontal scan periods in a row. In the operational amplifier in accordance with the present invention, the drive current does not fall short even if, for example, the voltage of a 2Hth waveform is lower than the voltage of a 1Hth waveform, thus achieving excellent display characteristics.

Figure 6:
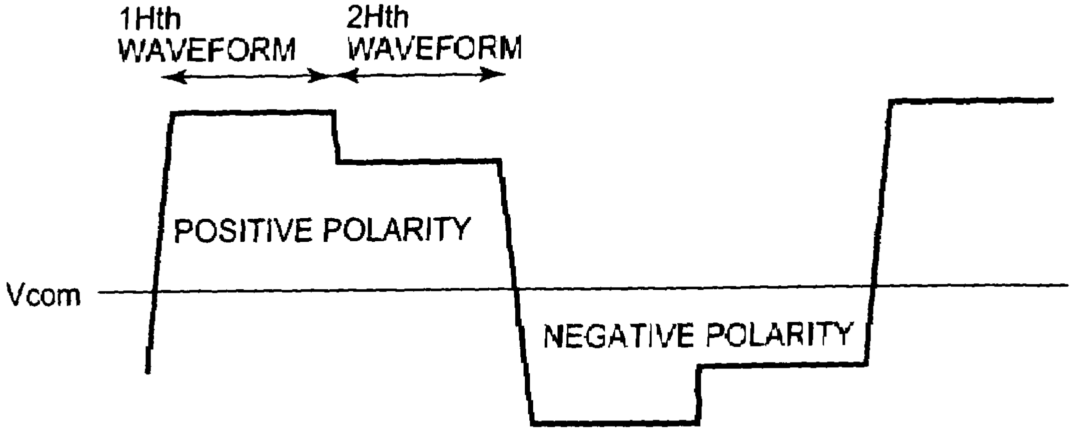
FIG. 6 is a waveform chart showing an output waveform of a 2H driving method of an LCD driver using an operational amplifier in accordance with an embodiment.
Figure 7B:
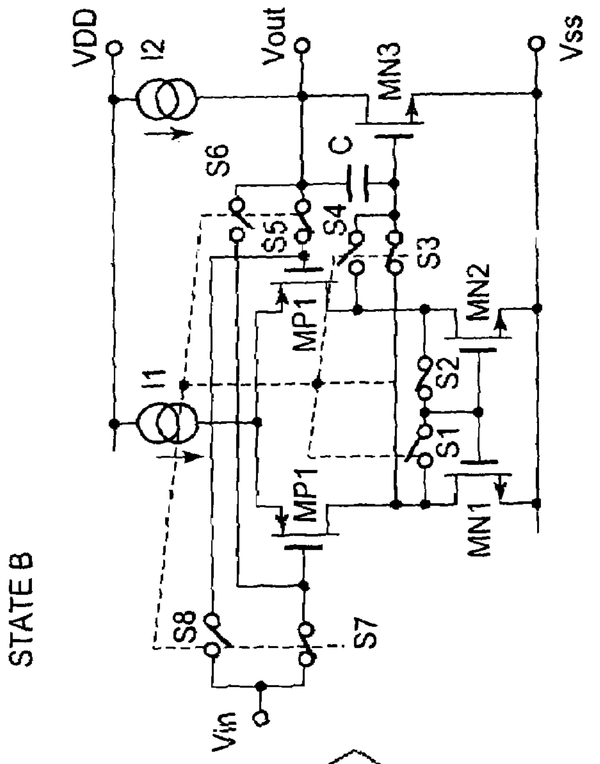
FIGS. 7A and 7B are circuit diagrams showing configurations of conventional operational amplifiers.
Figure 7A:
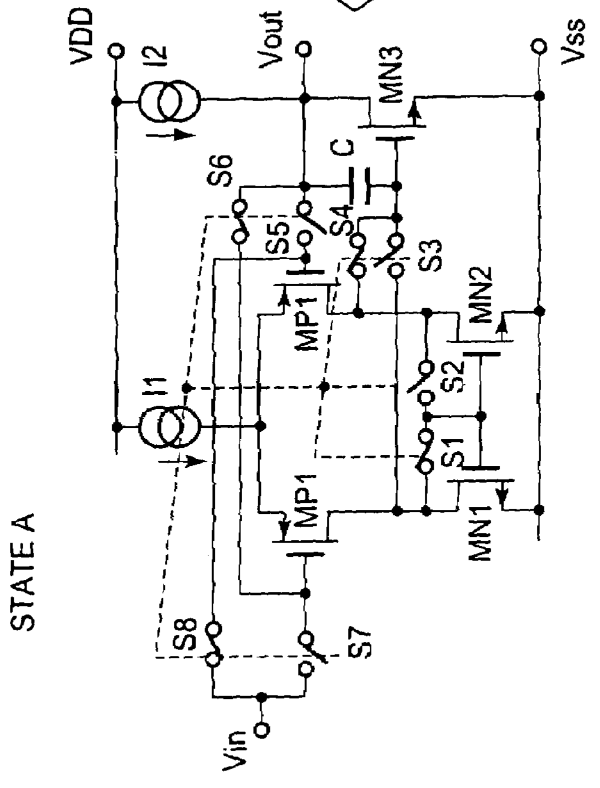
Figures 8A, 8B:
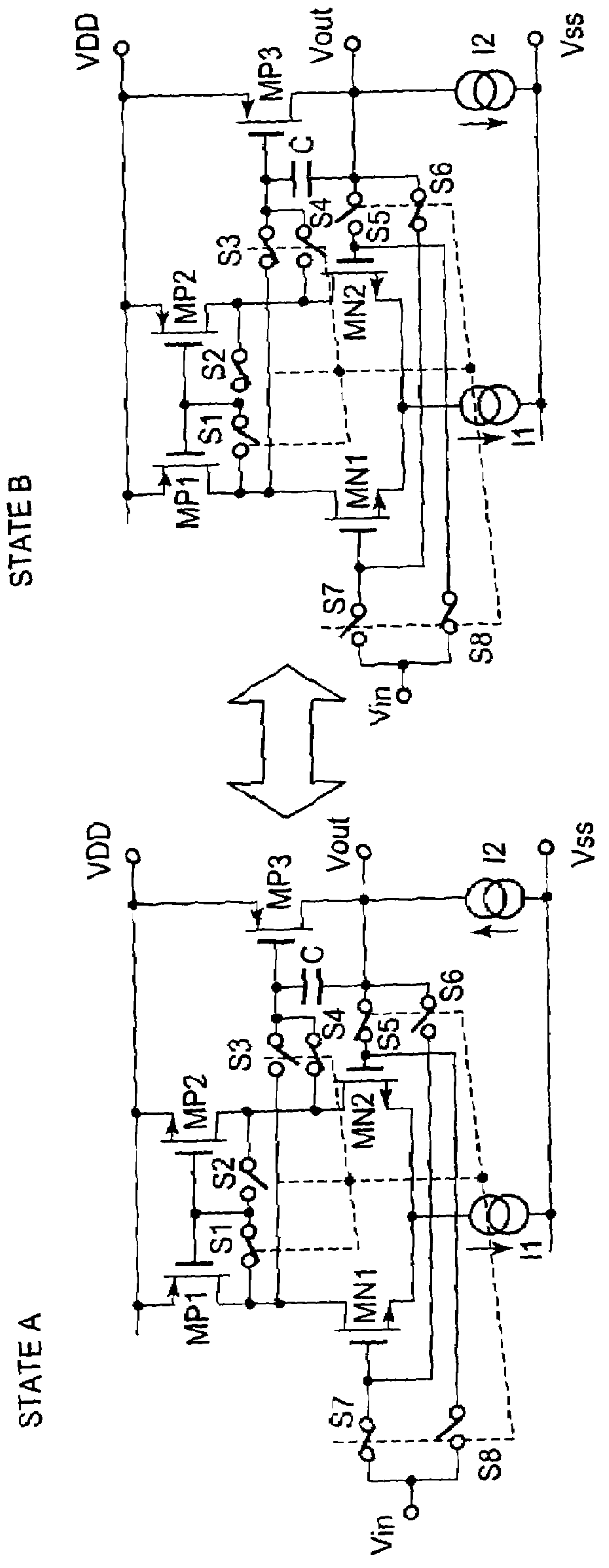
FIGS. 8A and 8B are circuit diagrams showing configurations of conventional operational amplifiers.
Figure 9:
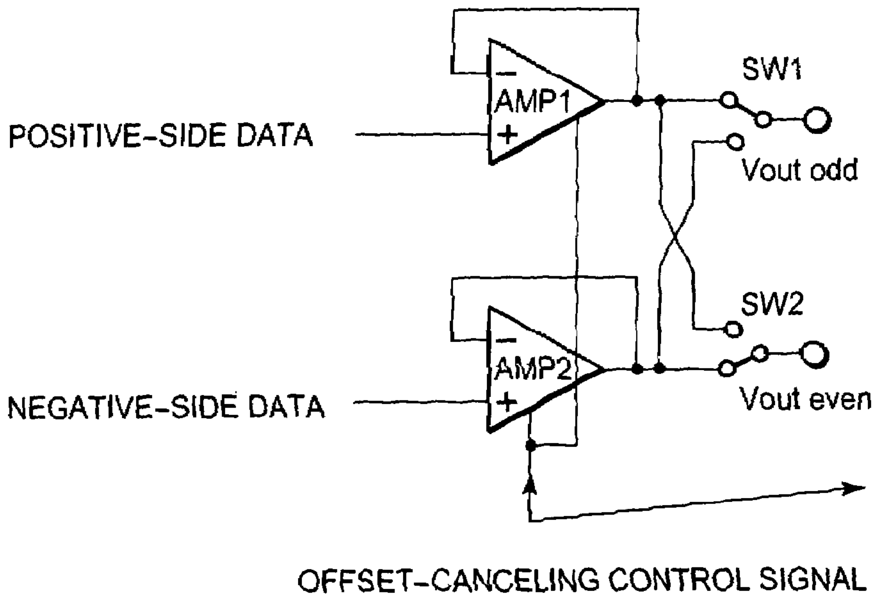
FIG. 9 is a circuit diagram showing a configuration example of an LCD driver using a conventional operational amplifier.
Figure 10:
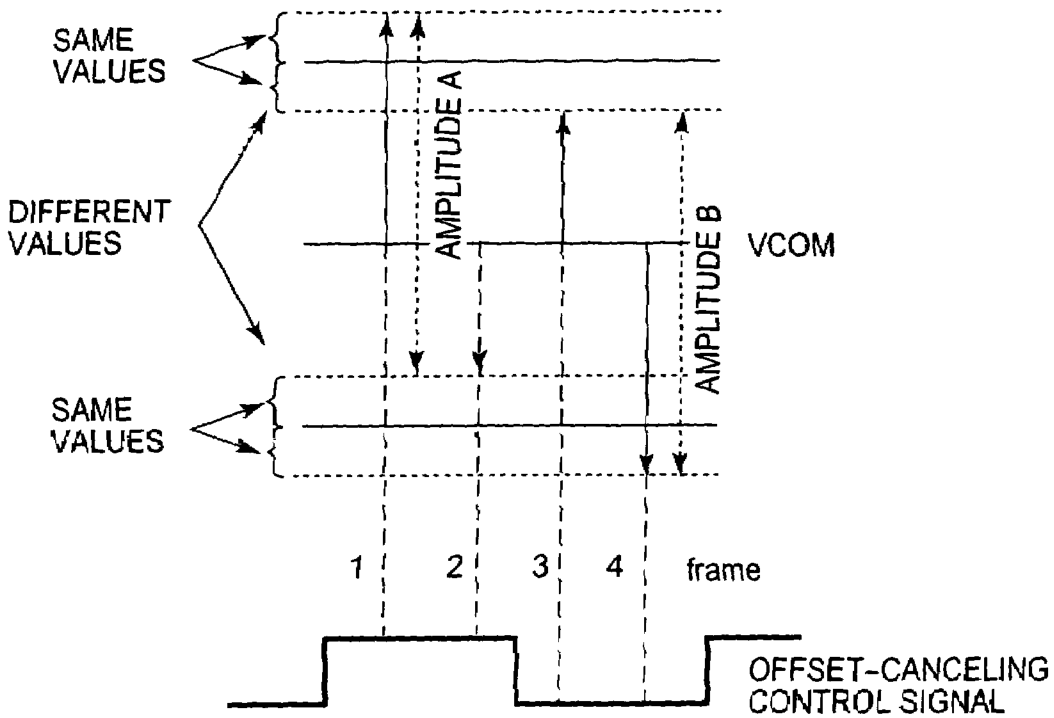
FIG. 10 is a waveform chart showing an output waveform of an LCD driver using a conventional operational amplifier.
Figure 11:
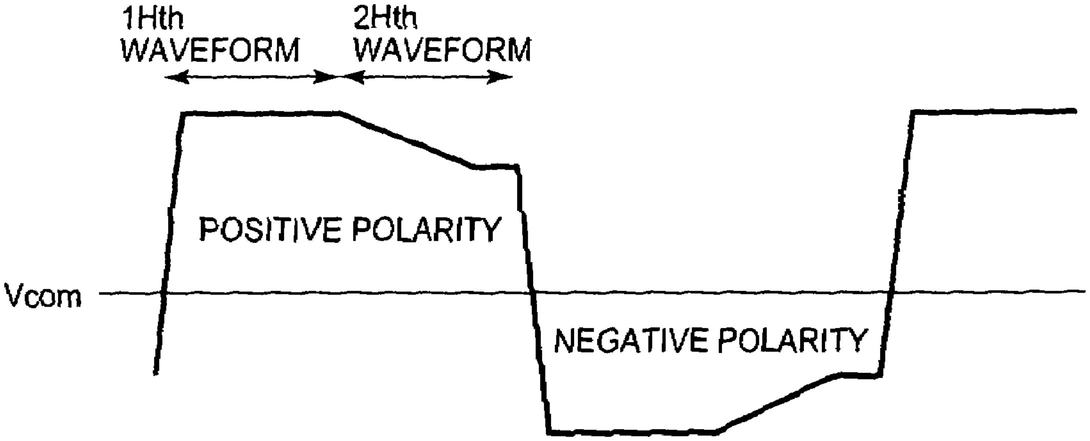
FIG. 11 is a waveform chart showing an output waveform of a 2H driving method of an LCD driver using a conventional operation amplifier.

FIG. 6 shows the output waveform of a 2H driving method of an LCD driver using the operational amplifier in accordance with the present embodiment. Conventionally, in a case where, for example, a 2Hth waveform falls on the positive polarity side in 2H inversion, an output waveform has been restricted by the constant current value of the amplifier since the output stage is a class-A amplifier having a single-side constant current configuration. Accordingly, there has been the problem that the falling waveform slows down, as shown in FIG. 11. On the other hand, a class-AB amplifier as used in the present invention has the capability of both sourcing and sinking an output current. For this reason, as shown in FIG. 6, the amplifier performs driving with a sufficient driving capability even if the 2Hth waveform falls and, therefore, the waveform does not slow down. In the same light, the waveform does not slow down either on the negative polarity side, though only the direction of drive current is reversed.

Next, an explanation will be made of a configuration of an operational amplifier 200 in accordance with the present invention equipped with a negative side-only offset-canceling circuit, by referring to FIG. 2. The operational amplifier 200 includes NMOS transistors MN1, MN2 and MN4, PMOS transistors MP1, MP2 and MP4, constant current sources I1, I2 and I3, a positive power supply VDD, a negative power supply VSS, constant voltage sources BP1 and BN1, a PMOS output transistor MP3, an NMOS output transistor MN3, switches SW1, SW2, SW3, SW4, SW5, SW6, SW7 and SW8, a resistor R, and a capacitor C.

The two PMOS transistors PN1 and PN2 constitute a differential pair. The sources of the PMOS transistors PN1 and PN2 are connected in common to each other. The constant current source I1 is connected between this common connection point and the positive power supply VDD. The constant current source I1 biases the differential pair constituted by the two PMOS transistors PN1 and PN2.

The NMOS transistors MN1 and MN2 are configured as a current mirror. The NMOS transistors MN1 and MN2 form an active load of the differential pair constituted by the PMOS transistors MP1 and MP2 and serve also as a differential-to-single-ended conversion function. The respective sources of the NMOS transistors MN1 and MN2 are connected in common to each other. This common connection point is connected to the negative power supply VSS. In addition, the respective gates of the NMOS transistors MN1 and MN2 are connected in common to each other. The break-type switch SW1 is inserted between the gate and the drain of the NMOS transistor MN1. The make-type switch SW2 is inserted between the gate and the drain of the NMOS transistor MN2.

The source of the NMOS output transistor MN3 is connected to the negative power supply VSS and the drain thereof is connected to the output terminal OUT. The source of the PMOS output transistor MP3 is connected to the positive power supply VDD and the drain thereof is connected to the output terminal OUT.

The PMOS output transistor MP3 and the NMOS output transistor MN3 are provided on the output sides of the NMOS transistors MN1 and MN2 and the PMOS transistors MP1 and MP2. The source of the PMOS output transistor MP3 is connected to the positive power supply VDD and the drain thereof is connected to the output terminal OUT. The source of the NMOS output transistor MN3 is connected to the negative power supply VSS and the drain thereof is connected to the output terminal OUT.

That is, one ends of the main current paths of the PMOS output transistor MP3 and the NMOS output transistor MN3 are connected in common to each other. In addition, the common connection point of the PMOS output transistor MP3 and the NMOS output transistor MN3 is connected to the output terminal Vout. That is, the PMOS output transistor MP3 and the NMOS output transistor MN3 are connected in series between the positive power supply VDD and a grounding terminal GND. In addition, the output terminal Vout is connected to a node between the PMOS output transistor MP3 and the NMOS output transistor MN3.

The break-type switch SW3 and the make-type switch SW4 are inserted between the respective drains of the two NMOS transistors MN1 and MN2 constituting a differential pair and the gate of the NMOS output transistor MN3. The constant current source I2 is connected between the positive power supply VDD and the gate of the PMOS output transistor MP3. In addition, the constant current source I3 is connected between the negative power supply VSS and the gate of the NMOS output transistor MN3.

The PMOS transistor MP4 and the NMOS transistor MN4 functioning as floating current sources are respectively provided between the NMOS transistors MN1 and MN2 and the PMOS output transistor MP3 and between the PMOS transistors MP1 and MP2 and the NMOS output transistor MN3. The source of the PMOS transistor MP4 is connected to the gate of the PMOS output transistor MP3 and the drain thereof is connected to the gate of the NMOS output transistor MN3. In addition, the gate of the PMOS transistor MP4 is biased by a constant voltage source BP1. The source of the NMOS transistor MN4 is connected to the gate of the NMOS output transistor MN3 and the drain thereof is connected to the gate of the PMOS output transistor MP3. The gate of the NMOS transistor MN4 is biased by a constant voltage source BN1. In normal operation, the gate voltage values of the PMOS transistor MP4 and the NMOS transistor MN4 are set by the constant voltage sources BP1 and BN1. Consequently, the PMOS transistor MP4 and the NMOS transistor MN4 function as floating current sources based on the gate voltage values thus set.

The break-type switch SW5 is inserted between the output terminal OUT and the gate of the PMOS transistor MP1. The make-type switch SW6 is connected between the output terminal OUT and the gate of the PMOS transistor MP2. The break-type switch SW7 is connected between the input terminal IN and the gate of the PMOS transistor MP2. The make-type switch SW8 is connected between the input terminal IN and the gate of the PMOS transistor MP1. A phase-compensating element, in which a zero point-introducing resistor R and a capacitor C are connected in series, is connected between the gate and the drain of the NMOS output transistor MN3 as a phase compensator.

In the present embodiment, one of the outputs of a differential amplifier configured with the differential pair and the active load is connected to the gate of the NMOS output transistor MN3 to which the phase-compensating element is connected. That is, either a connection point between the drains of the NMOS transistor MN1 and the PMOS transistor MP1 or a connection point between the drains of the NMOS transistor MN2 and the PMOS transistor MP2 is connected to the gate of the NMOS output transistor MN3 by the switches SW3 and SW4.

In the operational amplifier 200 in accordance with the present embodiment shown in FIG. 2, the switches SW1 to SW8 are all interlocked to one another and are driven simultaneously. The switches SW5 and SW6 are controlled so that the operational amplifier 100 serves as a negative feedback amplifier. That is, the inverting input terminal and the output terminal OUT of the operational amplifier 100 are connected in common to each other to provide a feedback.

A differential stage constituted by the PMOS transistors MP1 and MP2 operates in response to an input voltage range of approximately VSS to VDD−1 V. Note that the input stage is conceptually the same in switch operation and transistor operation as that shown in FIG. 1, except that the polarities of the transistors in the input stage are reversed. Accordingly, no further explanation will be made of the input stage.

In addition, the configuration and operation of the output stage only differ in the connection of the phase-compensating element from those of the operational amplifier 100, and the rest of the configuration and operation is completely the same as those of the operational amplifier 100. Whereas in the operational amplifier 100, the phase-compensating element is connected between the gate and the drain of the PMOS output transistor MP3, the phase-compensating element is connected between the gate and the drain of the NMOS output transistor MN3 in the operational amplifier 200. By adopting such a configuration as described above, the rising and falling slew rates are symmetrized in the negative polarity-only operational amplifier 200. If phase-compensating elements are provided both between the gate and the drain of the PMOS output transistor MP3 and between the gate and the drain of the NMOS output transistor MN3, as shown in the above-described documents of conventional examples, slew rates are not symmetrized.

Also in the operational amplifier 200, the output voltage Vo is output symmetrically with respect to the ideal output voltage value Vin by operating the switches, as explained above by referring to the operational amplifier 100. Consequently, by switching between the two states, i.e., states A and B, with the switches SW1 to SW8, the offset voltage is averaged, so to speak, spatially. As a result, the offset voltage reduces to zero and thus offset canceling has been achieved.

Now, an explanation will be made of examples of circuitry for materializing switches in a practical electronic circuit, by referring to FIGS. 3 and 4. FIG. 3 is a circuit diagram showing configurations of a make-type switch (FIG. 3B) and break-type switches (FIGS. 3C and 3D). In addition, FIG. 4 is a circuit diagram showing configurations of transfer-type switches. Note that a make-type switch has two terminals, goes into an open state when a control signal is at a low level, and goes into a closed state when the control signal is at a high level. A break-type switch has two terminals, goes into an open state when the control signal is at a high level, and goes into a closed state when a control signal is at a low level.

Figure 3A:
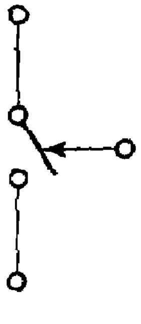
FIGS. 3A to 3D are circuit diagrams showing configuration examples of switches used for an operational amplifier in accordance with an embodiment.
Figure 3B:
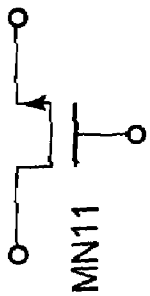
Figure 3C:
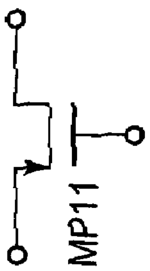
Figure 3D:
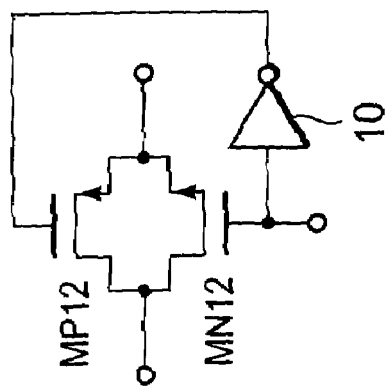

As the switch shown in FIG. 3A, it is possible to use the break-type switch shown in FIG. 3B or the make-type switch shown in FIG. 3C. The break-type switch shown in FIG. 3B is configured with an NMOS transistor MN11. The gate of the NMOS transistor MN11 functions as the control terminal of the switch, the source thereof functions as the first terminal of the switch, and the drain thereof functions as the second terminal of the switch. The switch is on/off-controlled through the gate. When the control signal input to the gate is at a high level, the source and the gate are in conduction with each other. When the control signal is at a low level, the source and the drain are cut off from each other. That is, if the switch is configured with an NMOS transistor, the switch turns on when the gate is at a high level and turns off when the gate is at a low level.

The break-type switch shown in FIG. 3C is configured with the PMOS transistor MP11. The gate of the PMOS transistor MP11 functions as the control terminal of the switch, the source thereof functions as the first terminal of the switch, and the drain thereof functions as the second terminal of the switch. The switch is on/off-controlled through the gate. When the control signal input to the gate is at a high level, the source and the gate are cut off from each other. When a strobe signal STB is at a low level, the source and the drain are in conduction with each other. That is, if the switch is configured with a PMOS transistor, the switch turns on when the gate is at a low level and turns off when the gate is at a high level.

As shown in FIG. 3D, a switch having a circuit configured by combining N- and P-type MOS transistors may be used as a make-type switch. The make-type switch shown in FIG. 3D is configured with an NMOS transistor MN12, a PMOS transistor MP12, and an inverter 10. This make-type switch is configured in such a manner that the sources of the NMOS transistor MN12 and the PMOS transistor MP12 are connected to each other and the drains of the NMOS transistor MN12 and the PMOS transistor MP12 are connected to each other. The sources connected in common to each other function as a first terminal and the drains connected in common to each other function as a second terminal.

A signal in opposite phase is input to each gate. That is, a control signal is input to the gate of the PMOS transistor MP12, whereas a control signal in opposite phase is input to the gate of the NMOS transistor MN12 through the inverter 10. When the control signal input to the gate is at a high level, the source and the gate are in conduction with each other. When the control signal is at a low level, the source and the drain are cut off from each other.

That is, when the gate of the NMOS transistor is at a high level, the gate of the PMOS transistor is set to a low level by the inverter 10. Accordingly, both the N- and P-type MOS transistors turn on, thus causing the switch to turn on. Conversely, when the gate of the NMOS transistor is at a low level, the gate of the PMOS transistor is set to a high level by the inverter 10. Accordingly, both the N- and P-type MOS transistors turn off, thus causing the switch to turn off.

Note that although not illustrated here, a switch having a circuit configured by combining NMOS and PMOS transistors may be used as a break-type switch. This break-type switch is configured in such a manner that the sources of the NMOS and PMOS transistors are connected to each other and the drains of the NMOS and the PMOS transistors are connected to each other. The sources connected in common to each other function as a first terminal and the drains connected in common to each other function as a second terminal. In addition, a control signal is input to the gate of the PMOS transistor, whereas a control signal is input to the gate of the NMOS transistor through the inverter.

Figure 4A:
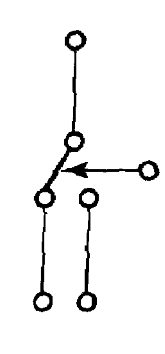
FIGS. 4A to 4D are circuit diagrams showing configuration examples of switches used for an operational amplifier in accordance with an embodiment.
Figure 4B:
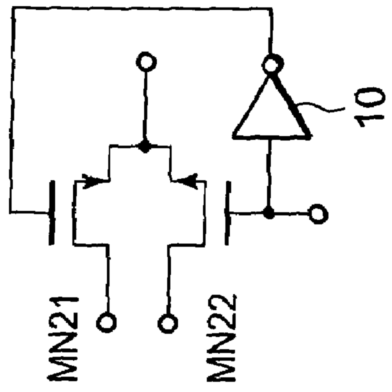
Figure 4C:
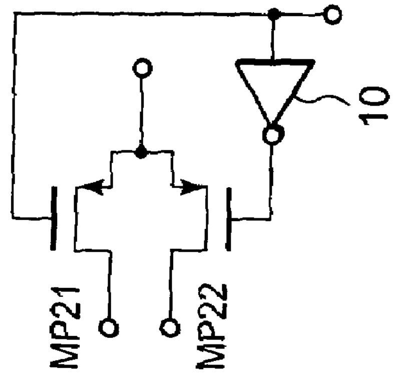
Figure 4D:
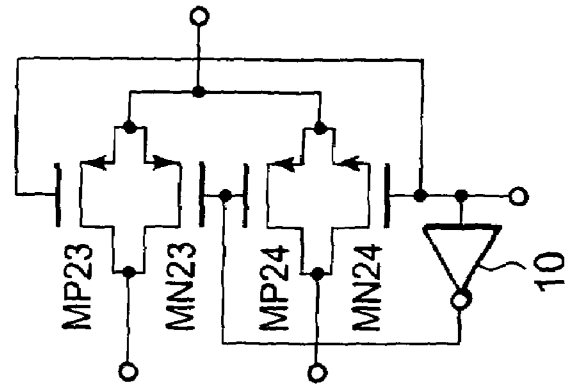

As the transfer-type switch shown in FIG. 4A and used in an LCD driver making use of the operational amplifiers shown in FIG. 1 and FIG. 2, it is possible to use one of the switch configurations shown in FIGS. 4B, 4C and 4D. The transfer-type switch shown in FIG. 4B is configured with two NMOS transistors MN21 and MN22 and an inverter 10. This transfer-type switch is configured in such manner that the sources of the NMOS transistors MN21 and MN22 are connected in common to each other, and this common connection point functions a common terminal. The drain of the NMOS transistor MN21 functions as a break-side terminal, and the drain of the NMOS transistor MN22 functions as a make-side terminal. In addition, a control signal is input to the gate of the NMOS transistor MN22, whereas a control signal is input to the gate of the NMOS transistor MN21 through the inverter 10. In other words, control signals opposite in phase to each other are input to the gates of the NMOS transistors MN21 and MN22. Consequently, when the input control signal is at a high level, the make-side terminal and the common terminal are in conduction with each other and, when the control signal is at a low level, the break-side terminal and the common terminal are in conduction with each other.

In addition, the transfer-type switch shown in FIG. 4C is configured with two PMOS transistors MP21 and MP22 and an inverter 10. This transfer-type switch is configured in such a manner that the sources of the PMOS transistors MP21 and MP22 are connected in common to each other, and this common connection point functions as a common terminal. The drain of the PMOS transistor MP21 functions as a break-side terminal, and the drain of the PMOS transistor MP22 functions as a make-side terminal. In addition, a control signal is input to the gate of the PMOS transistor MP22, whereas a control signal is input to the gate of the PMOS transistor MP21 through the inverter 10. In other words, control signals opposite in phase to each other are input to the gates of the PMOS transistors MP21 and MP22. Consequently, when the input control signal is at a high level, the make-side terminal and the common terminal are in conduction with each other and, when a strobe signal STB is at a low level, the break-side terminal and the common terminal are in conduction with each other.

As shown in FIG. 4D, a switch having two circuits configured by combining N- and P-type MOS transistors may be used as a transfer-type switch. The transfer-type switch shown in FIG. 4D is configured with NMOS transistors MN23 and MN24 and PMOS transistors MP23 and MP24. This transfer-type switch is configured in such a manner that the sources of the PMOS transistor MP23 and the NMOS transistor MN23 are connected in common to each other, and this common connection point is connected to the common terminal. In addition, the sources of the PMOS transistor MP24 and the NMOS transistor MN24 are connected in common to each other, and this common connection point is connected to the common terminal.

The drains of the NMOS transistor MN23 and the PMOS transistor MP23 are connected to each other and function as a break-side terminal. Likewise, the drains of the NMOS transistor MN24 and the PMOS transistor MP24 are connected to each other and function as a make-side terminal. In addition, a control signal is input to the gates of the NMOS transistor MN24 and the PMOS transistor MP23, whereas a control signal is input to the gates of the NMOS transistor MN23 and the PMOS transistor MP24 through the inverter 10. Consequently, when the input control signal is at a high level, the make-side terminal and the common terminal are in conduction with each other and, when the control signal is at a low level, the break-side terminal and the common terminal are in conduction with each other.

While switches having different configurations have been shown in FIG. 3 and FIG. 4, these switches can be used selectively according to the voltage variation ranges of nodes to which the switches are connected, in order to reduce resistance arising in the switches. For example, if the voltage of a node varies in the proximity of the voltage of the positive power supply VDD (for example, within a voltage range more than half the difference between the voltages of the negative power supply VSS and the positive power supply VDD closer to the voltage of the positive power supply VDD), the switches configured with the PMOS transistors shown in FIGS. 3C and 4C are used. In the present embodiment, the voltage applied to the switches is higher than VDD/2 since the negative power supply VSS is at a ground potential.

If the voltage of a node varies in the proximity of the voltage of the negative power supply VSS (for example, within a voltage range more than half the difference between the voltages of the negative power supply VSS and the positive power supply VDD closer to the voltage of the negative power supply VSS), the switches configured with the NMOS transistors shown in FIGS. 3B and 4B are used. Furthermore, if the voltage of a node varies widely from the voltage of the negative power supply VSS (GND) to the voltage of the positive power supply VDD, switches having circuits configured by combining the NMOS and PMOS transistors shown in FIGS. 3D and 4D are used.

Figure 5:
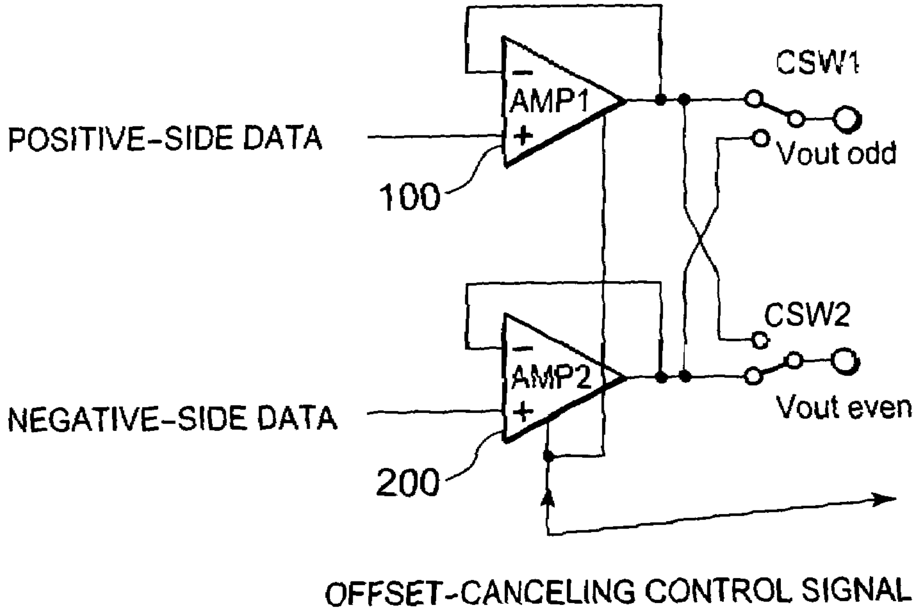
FIG. 5 is a circuit diagram showing a configuration example of an LCD driver using an operational amplifier in accordance with an embodiment.

FIG. 5 is a circuit diagram showing a configuration of an LCD driver in which the operational amplifier 100 shown in FIG. 1 is used as a positive-side (VDD/2 to VDD) amplifier AMP1 and the operational amplifier 200 shown in FIG. 2 is used as a negative-side (VSS to VDD/2) amplifier AMP2. The respective outputs of the amplifiers 100 and 200 are provided with selector switches CSW1 and CSW2 so that a signal can be output to either an odd-numbered output (Vout_odd) or an even-numbered output (Vout_even). Consequently, it is possible to output either a positive-side voltage or a negative-side voltage to the output in question no matter whether the output is an odd-numbered output or an even-numbered output.

In the LCD driver shown in FIG. 5, the selector switches CSW1 and CSW2 need to be operated over the entire input voltage range from VSS (GND) to VDD. Accordingly, as the selector switches CSW1 and CSW2, transfer-type switches configured as shown in FIG. 4D are used. On the other hand, the switches SW1 to SW4 shown in FIG. 1 are operated at potentials approximately 1 to 2 V lower than the voltage of the positive power supply VDD. Accordingly, as the switch SW1 of the operational amplifier 100 shown in FIG. 1, for example, a switch using the PMOS transistor shown in FIG. 3C is used.

In addition, the switches SW1 to SW4 shown in FIG. 2 are operated at potentials approximately 1 to 2 V higher than the voltage of the negative power supply VSS (GND). Accordingly, as the switch SW1 of the operational amplifier 200, a switch using the PMOS transistor shown in FIG. 3B is used.

Note that the operational amplifier in accordance with the present invention can also be used as a gamma amplifier (amplifier for gray-scale power supply) of an LCD module. In this case, the operational amplifier 100 shown in FIG. 1 is used as a gamma amplifier for covering positive potentials and the operational amplifier 200 shown in FIG. 2 is used as a gamma amplifier for covering negative potentials. Consequently, offset canceling can be achieved as in the case of using these operational amplifiers as output amplifiers.

As described heretofore, the operational amplifier in accordance with the present invention is a positive side or negative side-only operational amplifier the output stage of which is configured for class-AB amplification. With the operational amplifier, it is possible to most easily cancel an offset voltage (spatial offset canceling) in a time-averaged manner. By applying this operational amplifier to an LCD driver, it is possible to dramatically improve a characteristic referred to as "deviation" dependent on the offset voltage of the operational amplifier. Furthermore, as a result of the output stage having been configured for class-AB amplification, the operational amplifier can meet the requirements for so-called 2H inversion driving. In addition, as a result of having devised the insertion position of a phase-compensating element, it is possible to ensure the symmetry of rising and falling waveforms.

Furthermore, the operational amplifier has driving capabilities both in a sourcing direction and in a sinking direction also in the case of using the operational amplifier in accordance with the present invention as a gamma amplifier. Thus, it is possible to cancel an offset voltage in a time-averaged manner (spatial offset canceling).

The operational amplifier in accordance with the present invention is particularly suited for the output amplifier of an LCD driver used in the video field, or a gamma amplifier (amplifier for gray-scale power supply) that determines gamma correction. These operational amplifiers are required to be formed of circuitry having an offset voltage as small as possible and, therefore, offset canceling needs to be achieved by some means. Accordingly, in the present invention, an operational amplifier having a class-AB output stage has been realized using a simple circuit configuration, by making a contrivance in a conventional operational amplifier equipped with an offset-canceling circuit. In addition, by adopting the operational amplifier of the present invention as the output amplifier of an LCD driver system, it is now possible to meet the requirements for a driving method referred to as 2H inversion driving which is popular recently.

What is claimed is:

1. An operational amplifier comprising:

a first output transistor and a second output transistor connected in series between a first power supply and a second power supply;

an output terminal connected to a node between said first output transistor and said second output transistor;

a phase-compensating element provided either between the gate of said first output transistor and said output terminal or between the gate of said second output transistor and said output terminal;

a floating current source connected between the gate of said first output transistor and the gate of said second output transistor;

a third transistor and a fourth transistor constituting a differential pair;

a first constant current source connected to a common connection point to which the sources of said third transistor and said fourth transistor are connected in common and to said second power supply, so as to bias said differential pair;

a fifth transistor and a sixth transistor constituting a current mirror and functioning as the active load of said differential pair;

wherein a common connection point to which the sources of said fifth transistor and said sixth transistor are connected in common is connected to said first power supply, the gates of said fifth transistor and said sixth transistor are connected in common to each other, and one of the outputs of a differential amplifier constituted by said differential pair and said active load from a connection point between said differential pair and said active load is connected to one of the gates of said first output transistor and said second output transistor to which said phase-compensating element is connected;

a first switch inserted between the gate and the drain of said fifth transistor;

a second switch inserted between the gate and the drain of said sixth transistor;

a third switch connected between the drain of said sixth transistor and the gate of said first output transistor;

a fourth switch connected between the drain of said fifth transistor and the gate of said first output transistor;

a fifth switch connected between said output terminal and the gate of said third transistor;

a sixth switch connected between said output terminal and the gate of said fourth transistor;

a seventh switch connected between an input terminal and the gate of said fourth transistor; and an eighth switch connected between said input terminal and the gate of said third transistor;

wherein all of said first to eighth switches are controlled in conjunction with one another.

2. The operational amplifier according to claim 1, wherein the gate of said first output transistor and the gate of said second output transistor are biased so that a circuit including said first output transistor, said second output transistor, said phase-compensating element and said floating current source performs class-AB output operation.

3. The operational amplifier according to claim 1, wherein said floating current source includes: a seventh transistor, one of the source and drain of which is connected to the gate of said first output transistor and the other one of the source and drain of which is connected to the gate of said second output transistor; an eighth transistor, one of the source and drain of which is connected to the gate of said first output transistor and the other one of the source and drain of which is connected to the gate of said second output transistor; a first constant voltage source for biasing the gate of said seventh transistor; and a second constant voltage source for biasing the gate of said eighth transistor.

4. The operational amplifier according to claim 1, further comprising: a second constant current source connected between the gate of said first output transistor and said first power supply; and a third constant current source connected between the gate of said second output transistor and said second power supply.

5. The operational amplifier according to claim 4, wherein the current values of said second constant current source and said third constant current source are substantially the same.

6. The operational amplifier according to claim 1, wherein a first switch group including said first switch, said third switch, said fifth switch and said seventh switch and a second switch group including said second switch, said fourth switch, said sixth switch and said eighth switch are alternately switched on to establish connection.

7. The operational amplifier according to claim 1, wherein said phase-compensating element has a configuration in which a zero point-introducing resistor and capacitor are connected in series.

8. The operational amplifier according to claim 1, wherein said operational amplifier is equipped with a positive side-only offset-canceling circuit.

9. A drive circuit comprising: an operational amplifier according to claim 8 as a positive-side output amplifier; and an operational amplifier equipped with a negative-side offset-canceling circuit as a negative-side output amplifier.

10. A drive circuit comprising: an operational amplifier according to claim 8 as a positive-side gamma amplifier; and an operational amplifier equipped with a negative-side offset-canceling circuit as a negative-side gamma amplifier.

11. The operational amplifier according to claim 1, wherein said operational amplifier is equipped with a negative side-only offset-canceling circuit.

12. A driving method for driving a liquid crystal display device having a plurality of pixels to which display signals are respectively supplied by a plurality of signal lines, wherein said display signals are supplied to said signal lines using an operational amplifier according to claim 1, as an output drive amplifier of a liquid crystal drive circuit, thereby driving said plurality of pixels.

13. A circuit comprising:

a first transistor and a second transistor coupled in series between a first power line and a second power line;

an output terminal coupled to a first node between the first transistor and the second transistor;

a phase-compensating element provided either between the gate of the first transistor and the output terminal or between a gate of the second transistor and the output terminal;

a floating current source connected between the gate of the first transistor and the gate of the second transistor;

a third transistor and a fourth transistor configured to be a differential pair;

a constant current source coupled between a second node and the second power line, the second node being coupled to sources of the third transistor and the fourth transistor;

a fifth transistor and a sixth transistor configured to be a current mirror and to be an active load of the differential pair, each source of the fifth and the sixth transistors being coupled to the first power line;

a first switch coupled between a gate and a drain of the fifth transistor;

a second switch coupled between a gate and a drain of the sixth transistor;

a third switch coupled between the drain of the sixth transistor and a gate of the first transistor;

a fourth switch coupled between the drain of the fifth transistor and the gate of the first transistor;

a fifth switch coupled between the output terminal and a gate of the third transistor;

a sixth switch coupled between the output terminal and a gate of the fourth transistor;

a seventh switch coupled between an input terminal and the gate of the fourth transistor; and an eighth switch coupled between the input terminal and the gate of the third transistor, wherein one of the outputs of a differential amplifier constituted by said differential pair and said active load from a connection point between said differential pair and said active load is connected to one of the gates of said first transistor and said second transistor to which said phase-compensating element is connected.

14. The circuit according to claim 13, wherein all of the first to eighth switches are controlled in conjunction with one another.

* * * * *